(12) United States Patent
Yasuda et al.

(10) Patent No.: US 8,304,753 B2
(45) Date of Patent: Nov. 6, 2012

(54) IMAGE READING DEVICE

(75) Inventors: Shin Yasuda, Ashigarakami-gun (JP); Katsunori Kawano, Ashigarakami-gun (JP); Akihiko Naya, Ebina (JP); Tsunemasa Mita, Fujisawa (JP); Kazuo Baba, Ebina (JP)

(73) Assignee: Fuji Xerox Co., Ltd., Tokyo (JP)

( * ) Notice: Subject to any disclaimer, the term of this patent is extended or adjusted under 35 U.S.C. 154(b) by 420 days.

(21) Appl. No.: 12/725,043

(22) Filed: Mar. 16, 2010

(65) Prior Publication Data

US 2011/0042590 A1 Feb. 24, 2011

(30) Foreign Application Priority Data

Aug. 19, 2009 (JP) ................. 2009-190326

(51) Int. Cl.
  *H01L 31/0232* (2006.01)
  *H01L 31/09* (2006.01)
(52) U.S. Cl. .................. 250/559.04; 250/216
(58) Field of Classification Search ............. 250/559.04, 250/559.05, 216
See application file for complete search history.

(56) References Cited

FOREIGN PATENT DOCUMENTS

JP    A-2006-211234    8/2006

*Primary Examiner* — Tony Ko
(74) *Attorney, Agent, or Firm* — Oliff & Berridge, PLC

(57) ABSTRACT

An image reading device comprises: a light source; a first optical element that focuses light emitted from the light source, the emitted light being reflected by a medium in a first detection area; a first detector that outputs first detection information in response to arrival of light in the first detection area; a second optical element that guides to a second detection area a portion of the light emitted from the light source, which portion does not arrive at the reflective medium in the first detection area; a second detector that outputs second detection information responsive to detection of light at the second detection area; and a generator that generates image data of the medium by revising the first detection information on the basis of the second detection information.

12 Claims, 4 Drawing Sheets

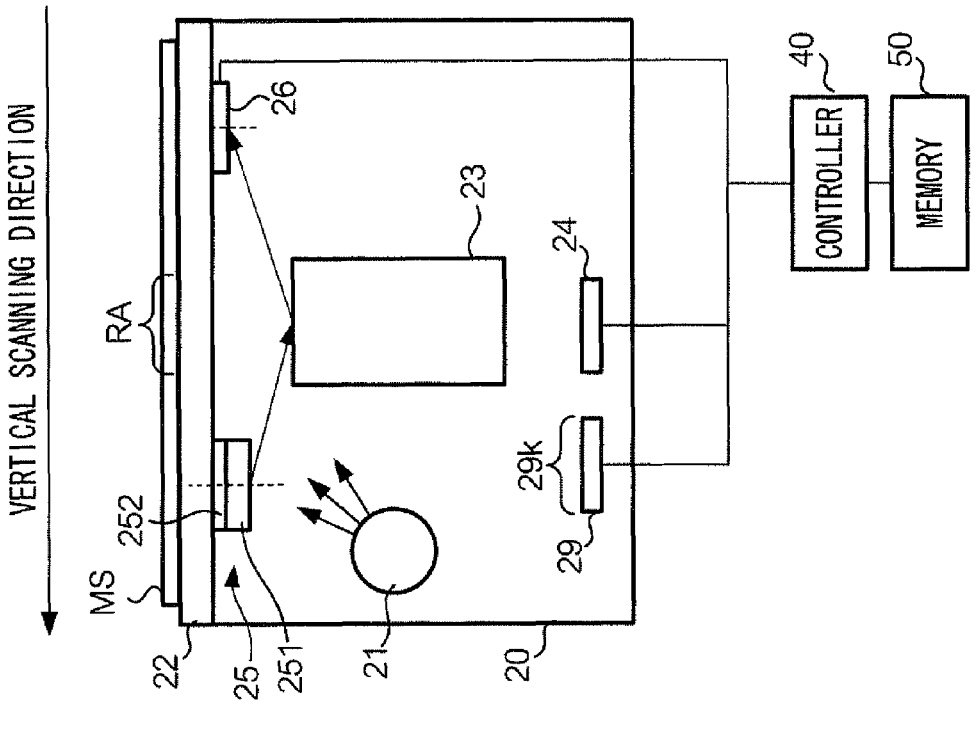
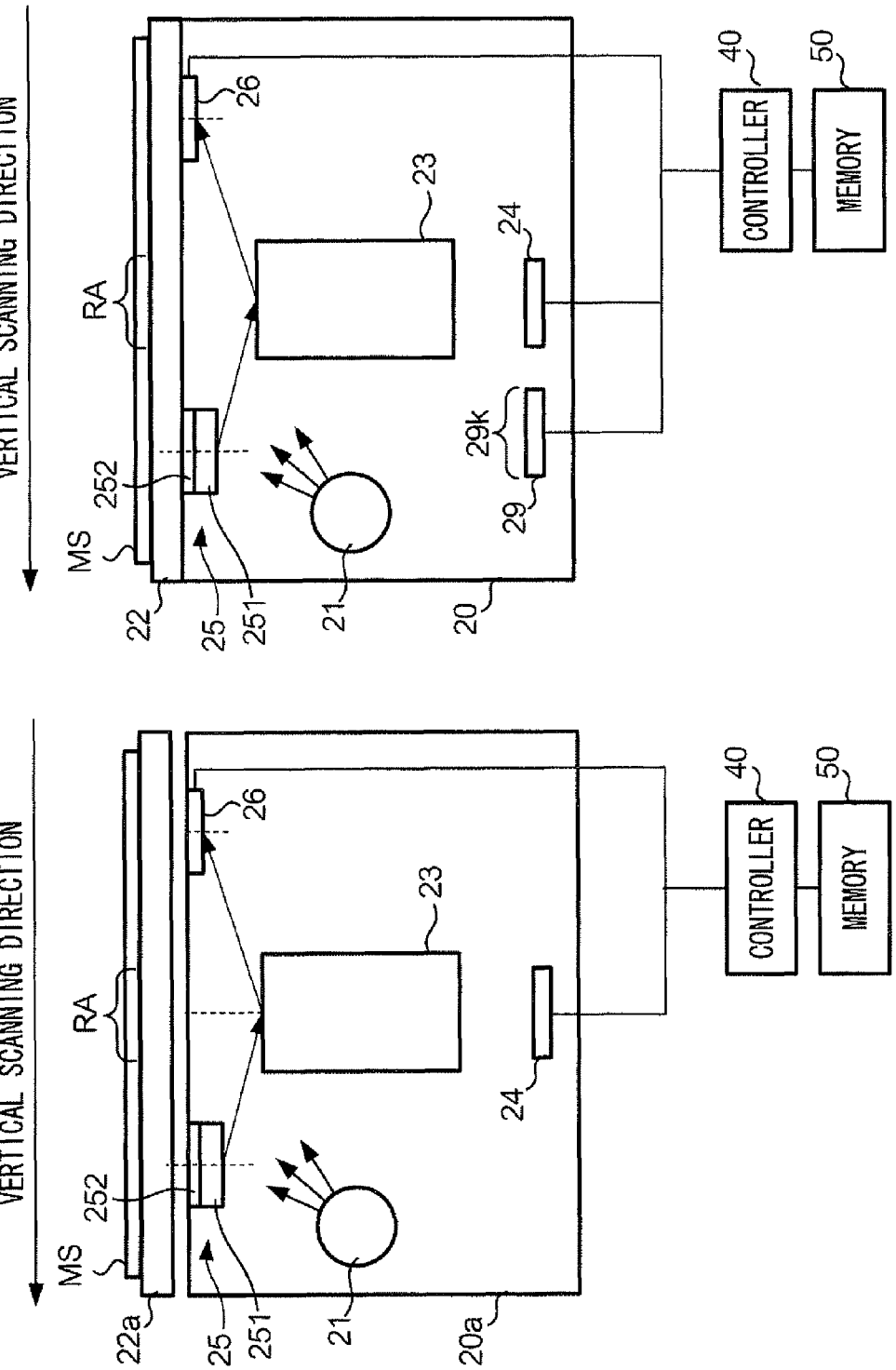

IMAGE READING DEVICE

CROSS-REFERENCE TO RELATED APPLICATIONS

This application is based on and claims priority under 35 U.S.C. 119 from Japanese Patent Application No. 2009-190326, which was filed on Aug. 19, 2009.

BACKGROUND

Technical Field

The present invention relates to an image reading device.
There is known in the art a technique referred to as shading correction. This technique is employed in a variety of optical systems to compensate for light fluctuation in an optical system, and is employed also in some image reading devices.

SUMMARY

According to an aspect of the present invention, there is provided an image reading device comprising: a light source; a first optical element that focuses light emitted from the light source, the emitted light being reflected by a medium in a first detection area; a first detector that outputs first detection information in response to arrival of light in the first detection area; a second optical element that guides to a second detection area a portion of the light emitted from the light source, which portion does not arrive at the reflective medium in the first detection area; a second detector that outputs second detection information responsive to detection of light at the second detection area; and a generator that generates image data of the medium by revising the first detection information on the basis of the second detection information.

BRIEF DESCRIPTION OF THE DRAWINGS

An exemplary embodiment of the invention will now be described in detail based on the following figures, wherein:

FIG. 7 is a schematic diagram of sensor unit 20; and

FIG. 8 shows yet another example of sensor unit 20.

DETAILED DESCRIPTION

Exemplary Embodiment

Figure 1:
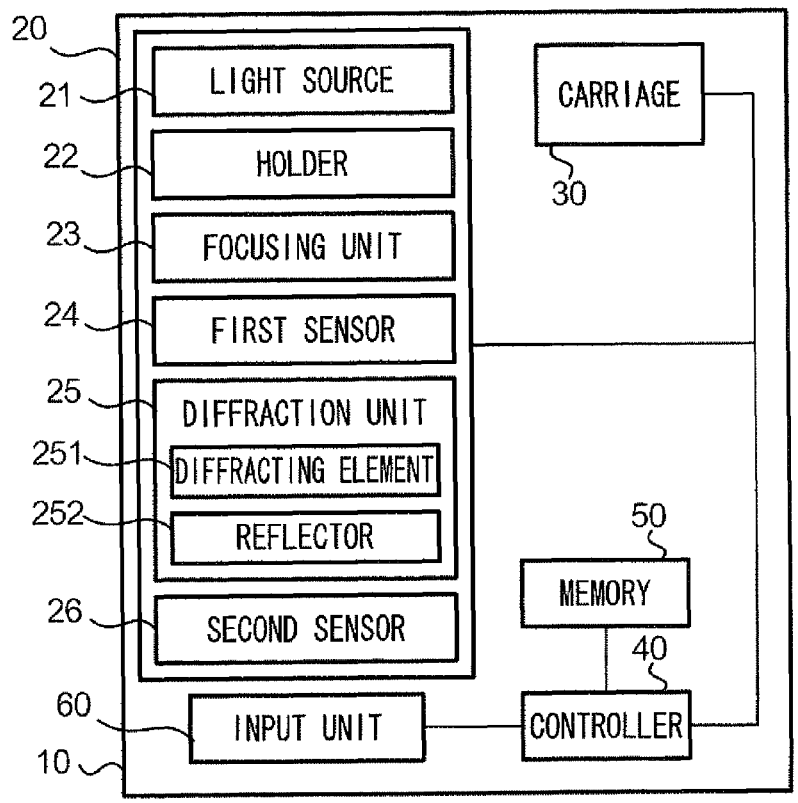
FIG. 1 shows a functional configuration of image reading device 10.

FIG. 1 is a block diagram showing a configuration of image reading device 10. An image in a predetermined area (hereinafter, "reading area RA") of a manuscript MS is read by sensor unit 20 (hereinafter, "main scan"). A detailed description of sensor unit 20 will be provided later in the text. Carriage 30 is equipped with a motor for moving manuscript MS to a next reading position after a main scan has been carried out. Each time a main scan is performed a sub-scan is performed in a direction perpendicular to the direction of the main scan (hereinafter, sub-scan direction). Each time a main scan is performed on manuscript MS, sensor unit 20 obtains and outputs image data of manuscript MS to controller 40.

Controller 40 includes a processor such as a central processing unit (CPU) and storing means such as a random access memory (RAM) to control sender unit 20 and carriage 30. Also, controller 40 performs image processing as will be described later in detail. During image processing RAM is used as a work area for the processor. Memory 50 may be a Read Only Memory (ROM), a hard drive, a semiconductor memory, or any other appropriate memory device, the memory being configured to store image data and other information. Input unit 60 includes a touch panel, a keyboard, or the like by which a user inputs instructions including, for example, a selection instruction, a confirmation instruction, a deletion instruction, and so on to image reading device 10. Instructions input by the user via input unit 60 are output under control of controller 40.

Description will now be directed to a configuration of sensor unit 20. Light source 21 includes a light source such as a Light Emitting Diode (LED) that emits light toward manuscript MS placed on a holder 22. Holder 22 on which manuscript MS is placed consists of an optically transparent member made of glass or the like. Emitted light passing though holder 22 is diffused by manuscript MS. Focusing unit 23 that includes a lens such as a gradient index lens (GRN) acts to focus light to obtain an equal-magnification image and thereby guide the diffused light to first sensor 24. First sensor 24 includes photoelectric conversion elements for detecting an intensity of light diffused by manuscript MS.

Diffraction unit 25 includes diffracting element 251 and reflector 252. Diffracting element 251 consists of a holographic material that is capable of recording an interference pattern. Examples of such materials include, for example, a photopolymer, dichromate salts in a gel, a photographic film containing silver halide, and others. Reflector 252 consists of an optically reflective material. Thus, diffraction unit 25 diffracts light emitted from light source 21, and this diffracted light reaches second sensor 28 along a path (a detailed description of this path will be provided later in the text). Second sensor 26 includes photoelectric conversion elements such as photo diodes to detect an intensity of light diffracted by diffraction unit 25. Each of first sensor 24 and second sensor 26 generate detection information according to intensity of light detected, respectively. Light detection information is output to controller 40 where it is generation and amendment of image data is carried out.

Figure 2:
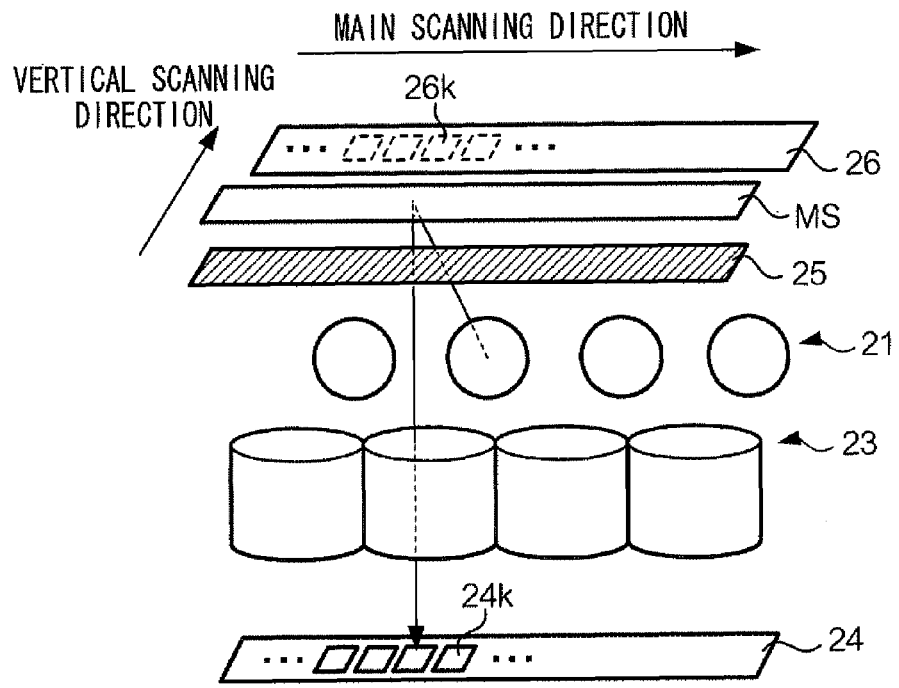
FIGS. 2 and 3 are schematic diagrams of sensor unit 20.

There will now be provided a detailed explanation of sensor unit 20. FIG. 2 is a schematic diagram of sensor unit 20. Manuscript MS is held by holder 22 (not shown in FIG. 2). Reading area RA of manuscript MS is scanned and image data of manuscript MS for reading area RA is obtained. Light source 21 is disposed in a position such that emitted light passing through holder 22 irradiates reading area RA. It is to be noted here that a shielding member (also not shown in FIG. 2) is disposed such that emitted light is prevented from arriving directly at sensor 24 or 26. Emitted light that arrives at reading area RA of manuscript MS is diffused at the surface of manuscript MS and guided by focusing unit 23 to arrive at first sensor 24. First sensor 24 includes an array of photoelectric conversion elements for detecting light (hereinafter, "detection areas $24k$") that arrives at least at one of detection areas 24K. Note that hereinafter the direction of arranged photoelectric conversion elements is referred to as "main scanning direction".

In the array of photoelectric conversion elements a charge is generated corresponding to an intensity of light detected at least at one of the respective detection areas $24k$. First sensor 24 generates a signal according to the charge generated, amplifies the generated signal, and outputs the amplified signal (hereinafter, "first detection information") to controller 40. The output signal includes a value that corresponds to the intensity of light detected at the at least one of the respective detection areas 24k. The light reflected at reading area RA of manuscript MS is then focused under equal-magnification by focusing unit 23 onto at the least one of the respective detection areas 24k. By use of the alignment procedure described above, an image in reading area RA of manuscript MS is read by detection of light arriving at least at one of the respective detection areas 24k. Controller 40 obtains first detection information from positions that differ relative to each other in their sub-scanning directions, to thereby obtain complete image data for manuscript MS.

Second sensor 26 includes an array of photoelectric conversion elements that detect intensities of light arriving at least at one of the photoelectric conversion elements (hereinafter, "detection areas 26k"). Second sensor 26 is disposed so that detection areas 26k are aligned in the main scanning direction. Positions of each of respective detection areas 26k and each of respective detection areas 24k correspond to each other in relation to the main scanning direction. In the array of photoelectric conversion elements a charge is generated corresponding to an intensity of light detected at least at one of the respective detection areas 26k. Second sensor 26 generates a signal according to the charge generated, amplifies the generated signal, and outputs the amplified signal (hereinafter, "second detection information") to controller 40. The output signal includes a value that corresponds to the intensity of light detected at the at least one of the respective detection areas 26k. The optical path of the light diffracted by diffraction unit 25 arrives at second sensor 26. Hereafter, alignment of diffraction unit 25 will now be described in detail.

Figure 3:
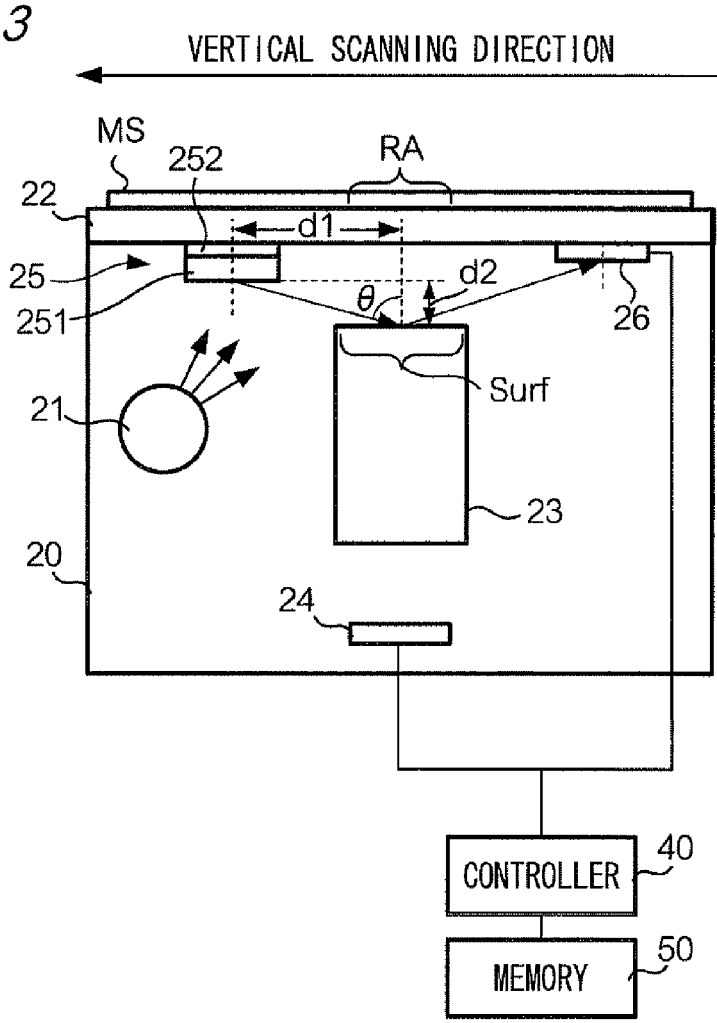

FIG. 3 shows a schematic diagram of sensor unit 20. As shown in the figure, diffraction unit 25 is disposed in the side of holder 22 facing light source 21, where the light emitted from light source 21 arriving at reading area RA is not completely cut off by diffraction unit 25. The light diffracted by diffracting element 251 and then propagates in diffracting element 251 is reflected by reflector 252. The reflected light again propagates in diffracting element 251 and exits diffraction unit 25 toward the upper surface S1 (i.e., the surface facing manuscript MS) of a lens included in focusing unit 23. In this way, the light exiting diffracting element 251 is diffracted. A case is now supposed such that: a distance between each of a center of surface S1 and of a diffraction unit 25 in relation to the sub-scanning direction is d1; and a distance between surface S1 and the surface at which the incident light from diffracting element 251 is diffracted is d2; then an angle θ of the incident light toward surface S1 satisfies the relation below.

$$\tan \theta = d1/d2$$

Diffraction unit 25 is disposed in a position such that total inertial reflection occurs at surface S1 for incident light having an incident angle θ, which position is dependent on a refractive index of the lens. As a result, a large proportion of the incident light travelling toward surface S1 undergoes regular reflection at surface S1. Light that does not undergo regular reflection at surface S1, and therefore enters focusing unit 23, necessarily passes through the lens. As a result, arrival of unwanted or extraneous light at first sensor 24 is obviated due to the action of equal-magnification of the lens for focusing light. Second sensor 26 is disposed in a position such that the light that has undergone regular reflection at surface S1 arrives at least at one of detection areas 26k. Second sensor 26 detects an intensity of light arriving at the at least one of the detection areas 26k and outputs corresponding detection information to controller 40.

Controller 40 measures fluctuations in intensity of light emitted from Light source 21 based on the second detection information. In principle, the greater an amount of light arriving at detection areas 26k, the larger an output signal of detection information becomes. In this regard, it is preferable that diffraction unit 25 is formed so as to diffract light emitted from light source 21, to as great an extent as possible, in accordance with a spectrum or other characteristics of the emitted light, so that any fluctuation can be measured highly accurately.

Figure 4:
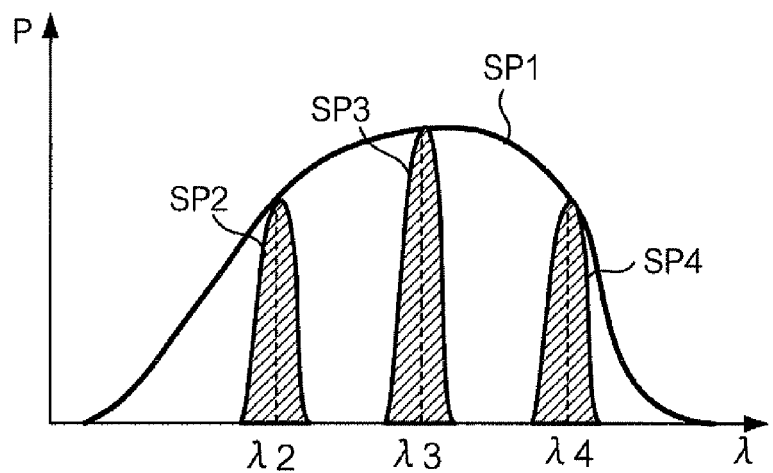
FIG. 4 shows a spectrum of light emitted from light source 21 and diffracted by diffraction unit 25.

FIG. 4 shows an example of a spectrum of light that is emitted from light source 21 and then diffracted by diffraction unit 25. In the figure the horizontal axis shows a wavelength λ and the vertical axis shows an intensity P for an incident and diffracted light. As shown in the figure, when the incident light having a spectrum as indicated by SP1 is emitted from light source 21, diffracted light has a spectrum having peaks SP2, SP3 and SP4. To realize the diffraction characteristic shown in FIG. 2, diffracting element 251 is formed by irradiating laser beams having wavelengths λ2, λ3 and λ4 and interfereable with the light emitted from light source 21 to a base material.

<Operation>

Operation of device 10 will now be described. First, description will be given with reference to FIG. 3 to an operation of reading an image. As described above, first detection information generated by first sensor 24 based on light emitted from light sensor 21 and then diffused by manuscript MS, is output to controller 40 and then stored in Memory 50. The first detection information represents a reading area RA of a scanned image of manuscript MS. Sensor unit 20 successively reads images of different reading areas RAs of manuscript MS after each movement of carriage 30 in the sub-scanning direction and outputs each read image to controller 40 upon completion of each main scanning. Controller 40 uses the detection information stored in memory 50 to generate image data of manuscript MS. This first detection information is used also in adjusting the generated image data of manuscript MS as described below.

Upon occurrence of a change in intensity of light emitted from light source 21, pixel values of the generated image data of manuscript MS inevitably change since such image data is generated based on emitted light diffused by manuscript MS. To evaluate a change in light emitted, there is provided a path for the emitted light, which path is different from a path of the light for obtaining image data of manuscript MS, so that second sensor 26 detects light that is not affected by the scanning process. Detection of an intensity of light unaffected by the scanning process will now be described in detail.

The second detection information generated by second sensor 26 based on the light emitted from light source 21 and diffracted by diffraction unit 25 is output to controller 40. Controller 40 stores the generated second detection information in memory 50. Controller 40 generates information representative of the intensity of the light diffracted by diffraction unit 25. Since the generated information does not depend on the light diffused by the light at reading area RA, the generated information can be taken as a reference for determining any fluctuation in light emitted from light source 21. Hereinafter, the second detection information is referred to as "luminosity reference information".

As described above, a portion of light emitted from light source 21 reaches at least one of detection areas 24k and 26k via different paths; namely, image data based on light diffracted by diffraction unit 25 and generated by reading manuscript MS at the same time as the luminosity reference information is generated based on light that is diffracted by diffraction unit 25 arrives at least at one of detection areas 26k. For example, a standard luminosity can be set at a predetermined level for light emitted from light source 21, which level is of an optimum intensity; and a difference between an intensity represented by the generated luminosity reference information and the standard luminosity can then be calculated so as to compensate for any fluctuation in the emitted light.

Based on the process described above, controller 40 revises detection information detected at least at one of detection areas 24k based on an amount of fluctuation determined an intensity of light detected at least at one of detection areas 26k. Accordingly, pixel values included in the image data of manuscript MS, which is generated based on the detection information, are revised. For example, if the standard luminosity is 255 and the intensity of the light detected at least at one of detection areas 26k is 230, it can be deduced that light passing through focusing unit 23 and arriving at first sensor 24 has decreased in intensity by 230/255 due to instability in output from light source 21. In this case, pixel values included in the image data obtained by at least one of detection areas 24k in corresponding relation to at least one of detection areas 26k can be revised appropriately by increasing the light intensity by 255/230.

As detection areas 26k of second sensor 26 are disposed in corresponding positions of detection areas 24k of first sensor 24, the revision of pixel values described above is performed for each set of detection areas 24k and 26k. In other words, fluctuations in luminosity resulting from instability in output from light source 21 is adjusted for each of pixel values corresponding to a set of areas. This adjustment process is performed after completion of a main scanning process. The adjustment process can be performed after completion of all sub-scanning processes i.e., after complete image data for manuscript MS had been obtained. Alternatively, the adjustment process can be performed after detection at each of detection areas 24k and at a respective one of the detection areas 26k has been completed.

As will be apparent from the foregoing description, controller 40 revises pixel values included in image data on the basis of luminosity reference information, generates revised image data based on the revised pixel values, and stores the revised image data in memory 50. The revised image data and the luminosity reference information are generated based on light emitted from light source 21 and detected at least at one of detection areas 24k and 26k, respectively. Thus, fluctuations in light intensity resulting from instability in output from light source 21 is measured at a time of obtaining image data of manuscript MS. Thus, if an intensity of emitted light fluctuates during scanning manuscript MS, the obtained image data is adjusted in real time based on luminosity reference information that is representative of a current fluctuation. In this way, compensation of fluctuations can be readily incorporated in providing finalized image data.

It is to be noted here that the exemplary embodiment described above can be modified in various aspects as outlined below.

MODIFIED EXAMPLE 1

In the exemplary embodiment, a transparent hologram that includes diffracting element 251 and reflector 252 is provided. It is possible to provide an optical element for diffracting emitted light, which element functions as a reflective hologram. In this case, emitted light from light source 21 is diffracted at the surface of the reflective hologram, then undergoes regular reflection at surface S1, and finally arrives at second sensor 26. Also, it is possible to absorb light passing through the reflective hologram without undergoing reflection using a light absorber that is provided in place of reflector 252. As a result, arrival of light at second sensor 26 that has not undergone diffraction in the reflective hologram is obviated and thereby noise luminosity standard information is avoided.

MODIFICATION EXAMPLE 2

Figure 5:
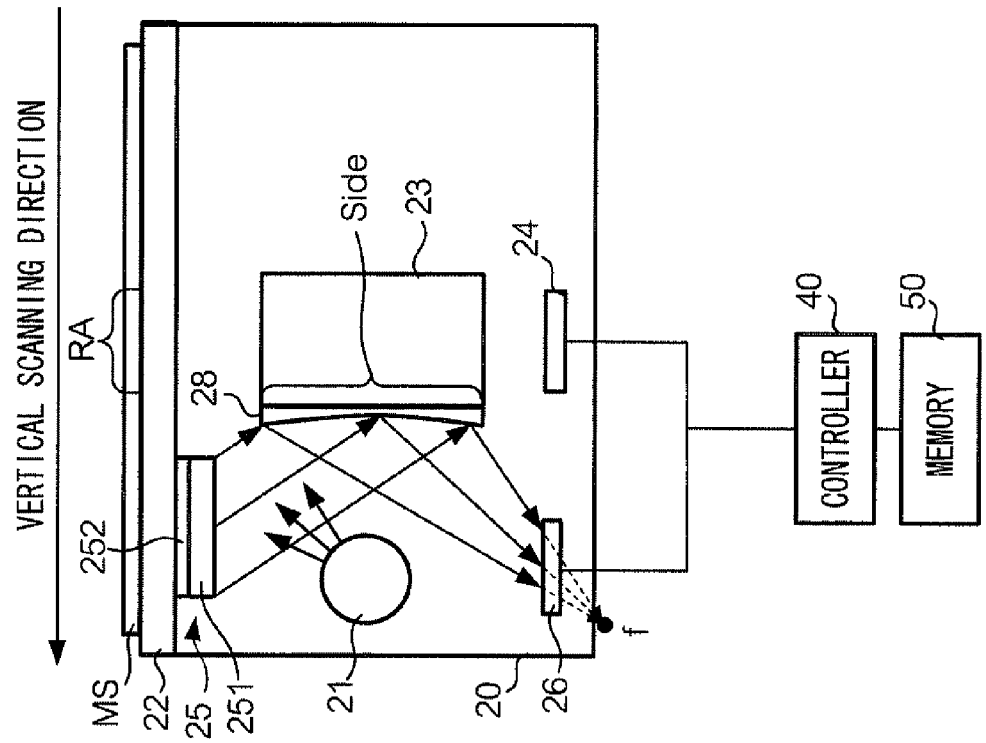
FIGS. 5 and 6 show further examples of sensor unit 20.

In the exemplary embodiment, light diffracted by diffraction unit 25 is regularly reflected at surface S1 to be guided to second sensor 26. It is possible to employ a planar mirror for guiding the light to second sensor 26. FIG. 5 shows a schematic diagram of sensor unit 29 according to the modified example 2. As shown in the figure, a planar mirror 27 is disposed for example in a surface S2 of focusing unit 23 facing diffraction unit 25. In this case, second sensor 26 is disposed in a position where the light is diffracted by diffraction unit 25 and reflected regularly by planar mirror 27. An interference pattern is recorded on the diffracting element 251 upon exposure to light such that emitted light from light source 21 is diffracted toward planar mirror 27.

Figure 6:
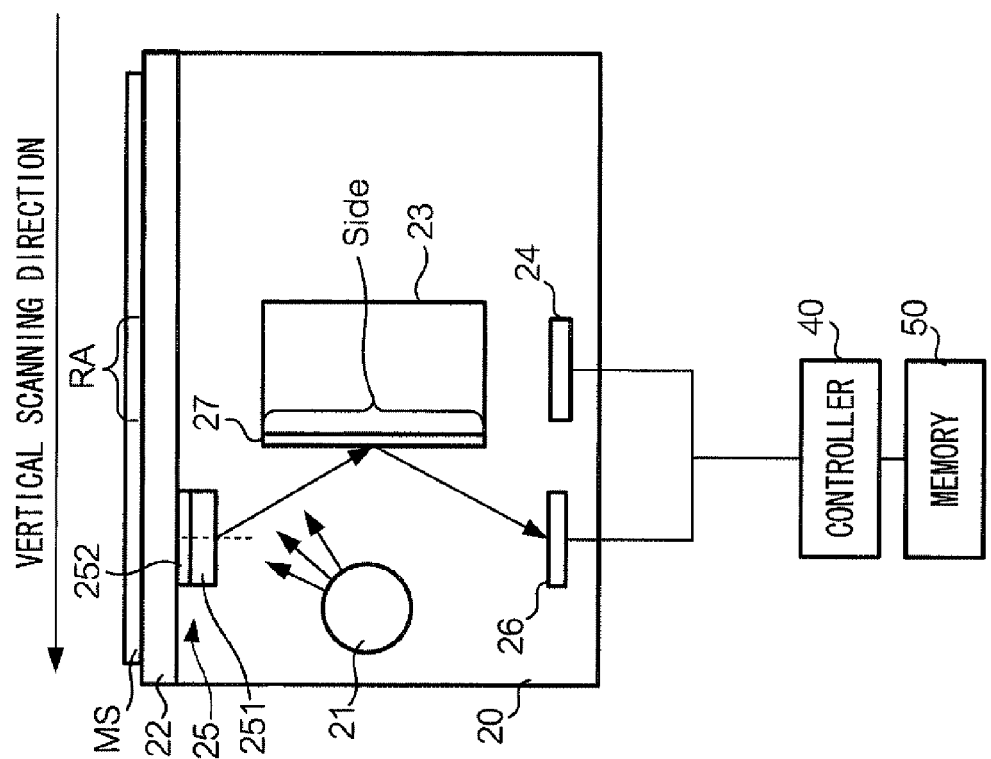

In modified example 2, a planar mirror is provided to reflect light diffracted by diffraction unit 25. However, it is also possible to guide the diffracted light to second sensor 26 using a focusing mirror. FIG. 6 shows a schematic diagram of sensor unit 20 according to modified example 3. As shown in the figure, a focusing mirror 28 is disposed on a side surface (Surface S2) of focusing unit 23 facing diffraction unit 25. Second sensor 26 is disposed at a position at which the light diffracted by diffraction unit 25 and reflected by focusing mirror 28 arrives. With regard to focusing mirror 28, a condition of the surface, light axis, and position in the surface S2 can be each determined so that parallel incident light beam from diffraction unit 25 after being reflected by focusing mirror 28 is focused on detection areas 26k. Preferably, diffraction unit 25 according to this modified example has a larger size than that of second sensor 26. In this case, the intensity of light per unit area arriving at detection areas 26k become larger than that diffracted by diffraction unit 25. In other words, an accuracy of detected information output by second sensor 26 becomes higher than in a case where planar mirror 27 is employed. As a result, less fluctuation in light intensity occurs and therefore is detected.

MODIFIED EXAMPLE 4

In the exemplary embodiment, diffraction unit 25 which includes a transparent hologram is employed to guide the emitted light to second sensor 26. It is possible to employ other optical devices that diffract the emitted light, which includes a diffractive lens, a combination of a reflective hologram, a lens, a mirror and the like. In the exemplary embodiment, holder 22 is fixed to sensor unit 20, as a result of which a relative position between holder 22 and remaining members of sensor unit 20 is maintained constant. Moreover, it is possible to dispose a holder independent of sensor unit 20. FIG. 7 shows a schematic diagram of sensor unit 20a according to modified example 5. Manuscript MS is held by holder 22a, which holder is fixed directly to a cabinet of image reading device 10. Sensor unit 20a includes light source 21, focusing unit 23, first sensor 24 and second sensor 26. Sensor unit 20a is moved by a movement mechanism such as a motor (not shown in the figure) to a position for a next scanning in the sub-scanning direction each time a main scanning process has been completed, and before a next main scanning process is initiated. In this way, sensor unit 20a repeats the main scanning process and the sub-scanning process while moving to appropriate positions so as to obtain complete image data for manuscript MS.

MODIFIED EXAMPLE 6

In the exemplary embodiment, controller 40 revises image data by comparing first and the second detection information detected at least at one of respective detection areas 24k and 26k. It is possible to perform the adjustment process based on first and second detection information detected at positions that do not co-correspond. Alternatively, the adjustment process can be performed on the basis only of the second detection information obtained from at least one of detection areas 26k. It is to be noted here that image reading device 10 performs adjustment of luminosity of image data by obtaining luminosity reference information while scanning manuscript MS, in a manner similar to that employed in the exemplary embodiment.

MODIFIED EXAMPLE 7

In the exemplary embodiment, image reading device 10 obtains luminosity reference information while reading an image of manuscript MS and adjusts a luminosity of read image data based on the luminosity reference image. It is possible also to generate luminosity reference information prior to scanning manuscript MS. In this case, adjustment of image data of manuscript MS is performed after complete image data of manuscript MS is obtained using a method determined on a basis of the luminosity reference information.

MODIFIED EXAMPLE 8

In the exemplary embodiment, image data is revised as a result of measurement of fluctuations in the emitted light due to instability in output of light source 21. It is possible to revise image data by measuring a change of signals occurring regardless of light arriving at least at one of detection areas 24k. The signals may be attributed to noise due to a dark current occurring in a line sensor or to leaked light, i.e., light which arrives at least at one of detection areas 24k without passing through focusing unit 23. Hereinafter, such a noise level is referred to as a "dark reference value".

FIG. 8 shows a schematic diagram of sensor unit 20 according to the modified example 8. A third sensor 29 includes an array of photoelectronic conversion elements each of which detects an intensity of light at a respective at least one of detection areas 29k to thereby generate detection information and output the information to controller 40. Third sensor 29 is disposed along the sub-scanning direction at a position in the arrangement of detection areas 29k at a predetermined distance from first sensor 24, at which light passing through focusing unit 23 does not arrive. Each at least one of detection areas 24k corresponds to a respective at least one of detection area 29k in positions in relation to the sub scanning direction. In the alignment of the optical elements according to modified example 8, light detected by the photoelectronic elements at detection areas 29k does not include light diffused by manuscript MS. Generation of detection information (third detection information) by third sensor 29 and obtaining image data of manuscript MS are performed at the same time. Thus, the output third detection information is provided to controller 40 together with the obtained image data.

The third detection information is used as a reference signal (hereinafter referred to as noise reference information) representative of fluctuation in signals caused by factors that are not relevant to arrival of light at least at one of detection areas 24k. For example, a background noise level is determined at each of detection areas 24k when is no substantial noise is present. True noise is determined by measuring a difference between noise reference information detected at each of detection areas 29k and a background noise level. Controller 40 revises detection information detected at least at one of detection areas 24k based on the true noise present at least at one of respective detection areas 29k.

For example, when noise reference information "5" is detected at least at one of detection areas 29k at which a background noise level is "0," a luminosity detected at least at one of detection areas 24k corresponding to the at least one of the detection areas 29k is reduced by "5." Similar adjustment is performed in each set of detection areas 24k and 29k, to remove a noise for each set of the detection areas 24k and 29k. The adjustments can be performed each a single main scanning has been completed. Alternatively, noise reference information is obtained in advance, and adjustment of image data is performed after complete image data for manuscript MS has been obtained using a method employing noise reference information. In a case where detection of leaked light is unnecessary, it is possible to dispose a cover over third sensor 29 to thereby shut out light moving toward third sensor 29.

In modified example 8, controller 40 revises luminosity of image data based on noise detected at least at one of detection areas 29k, generates the revised data based on the revised luminosity and stores the revised image data in memory 50. Evaluation of noise levels and scanning of manuscript MS are thus performed at a same time, and accordingly if a noise level changes during scanning of manuscript MS, a transient change in the noise level is detected and taken into account in revising image data appropriately. As a result, finalized image data does not contain any fluctuation in pixel vales that may otherwise be present due to fluctuations in noise level.

The foregoing description of the embodiments of the present invention is provided for the purposes of illustration and description. It is not intended to be exhaustive or to limit the invention to the precise forms disclosed. Obviously, a large number of possible modifications and variations will be apparent to practitioners skilled in the art. The embodiments were chosen and described in order to best explain the principles of the invention and its practical applications, thereby enabling others skilled in the art to understand the invention in various embodiments, and with the various modifications as suited to a particular use that may be contemplated. It is thus intended that the scope of the invention be defined by the following claims and their equivalents.

What is claimed is:

1. An image reading device comprising:
   a light source;
   a first optical element that focuses light emitted from the light source, the emitted light being reflected by a medium in a first detection area;
   a first detector that outputs first detection information in response to arrival of light in the first detection area;
   a second optical element that guides to a second detection area a portion of the light emitted from the light source, which portion does not arrive at the reflective medium in the first detection area;
   a second detector that outputs second detection information responsive to detection of light at the second detection area; and a generator that generates image data of the medium by revising the first detection information on the basis of the second detection information.

2. The image reading device according to claim 1, wherein the second optical element is disposed to cause light that is emitted from the light source and then reflected by the first optical element to arrive at the second detection area.

3. The image reading device according to claim 2, wherein the first optical element includes a first and second optical surfaces, such that: light reflected by the medium is allowed to pass through the first optical surface to arrive at the first detection area; and light from the second optical element is reflected on the second optical surface and is allowed to arrive at the second detection area.

4. The image reading device according to claim 3, the second optical element diffracts the light emitted from the light source toward the first optical element.

5. The image reading device according to claim 3, the second optical element reflects the light emitted from the light source toward the first optical element.

6. The image reading device according to claim 2, the second optical element diffracts the light emitted from the light source toward the first optical element.

7. The image reading device according to claim 2, the second optical element reflects the light emitted from the light source toward the first optical element.

8. The image reading device according to claim 1, wherein the first optical element includes a first optical surface such that: light reflected by the medium is allowed to pass through the first optical surface to arrive at the first detection area; and light from the second optical element that is reflected at the first optical surface is allowed to arrive at the second detection area.

9. The image reading device according to claim 8, the second optical element diffracts the light emitted from the light source toward the first optical element.

10. The image reading device according to claim 8, the second optical element reflects the light emitted from the light source toward the first optical element.

11. The image reading device according to claim 1, the second optical element diffracts the light emitted from the light source toward the first optical element.

12. The image reading device according to claim 1, the second optical element reflects the light emitted from the light source toward the first optical element.

* * * * *